US011989495B2

(12) United States Patent
Das et al.

(10) Patent No.: US 11,989,495 B2
(45) Date of Patent: May 21, 2024

(54) SYSTEMS AND METHODS FOR PREDICTING FILM THICKNESS USING VIRTUAL METROLOGY

(71) Applicant: Applied Materials, Inc., Santa Clara, CA (US)

(72) Inventors: Debkalpo Das, Tamil Nadu (IN); Raman K Nurani, Chennai (IN); Ramachandran Subramanian, Chennai (IN); Bibhavendra Singh, Lucknow (IN); Bharath Sundar, Chennai (IN)

(73) Assignee: Applied Materials, Inc., Santa Clara, CA (US)

( * ) Notice: Subject to any disclaimer, the term of this patent is extended or adjusted under 35 U.S.C. 154(b) by 504 days.

(21) Appl. No.: 17/139,330

(22) Filed: Dec. 31, 2020

(65) Prior Publication Data

US 2022/0207223 A1 Jun. 30, 2022

(51) Int. Cl.

| | |
|---|---|
| ***G06F 30/33*** | (2020.01) |
| ***G06F 18/213*** | (2023.01) |
| ***G06F 18/214*** | (2023.01) |
| ***H01L 21/70*** | (2006.01) |

(52) U.S. Cl.

CPC ............ *G06F 30/33* (2020.01); *G06F 18/213* (2023.01); *G06F 18/214* (2023.01); *H01L 21/702* (2013.01)

(58) Field of Classification Search

CPC ...... G06F 30/33; G06F 18/213; G06F 18/214; G06F 18/00; H01L 21/702; H01L 22/12; H01L 22/20; G06V 10/774; G06V 10/10; G06V 10/20

See application file for complete search history.

(56) References Cited

U.S. PATENT DOCUMENTS

| | | | | |
|---|---|---|---|---|
| 4,733,974 | A * | 3/1988 | Hagerman | G01K 3/04 702/182 |
| 9,915,522 | B1 * | 3/2018 | Jiang | G03F 7/70616 |
| 2005/0071039 | A1 * | 3/2005 | Mitrovic | H01L 22/20 700/121 |

(Continued)

FOREIGN PATENT DOCUMENTS

| | | | | |
|---|---|---|---|---|
| WO | WO-2021081213 A1 * | 4/2021 | | G06F 30/27 |
| WO | WO-2022122845 A1 * | 6/2022 | | |

OTHER PUBLICATIONS

A. Ferreira et al., "Virtual metrology models for predicting avera PECVD oxide film thickne," 2011 IEEE/SEMI Advanced Semiconductor Manufacturing Conference, Saratoga Springs, NY, USA, 2011, pp. 1-6, doi: 10.1109/ASMC.2011.5898187. (Year: 2011).*

*Primary Examiner* — Stacy Whitmore

(74) *Attorney, Agent, or Firm* — Lowenstein Sandler LLP

(57) ABSTRACT

A method includes obtaining sensor data associated with a deposition process performed in a process chamber to deposit film on a surface of a substrate. The method further includes generating a plurality of physics based outputs using a transformation function and the sensor data. The method further includes mapping the physics based outputs to a training set. The method further includes training a virtual model based on the training set and the sensor data, wherein the virtual model is trained to generate predictive metrology data associated with the film.

23 Claims, 6 Drawing Sheets

200

Initialize a training set T to { } 210

Obtain sensor data associated with a prior deposition process performed to deposit a film on a surface of a prior substrate 212

Preprocess the sensor data associated with the prior deposition process 214

Generate one or more physics based outputs using a transformation function and the preprocessed data 216

Map the physics based output(s) to the substrate of the training set T 218

Is set T sufficient for training? 220

NO

YES

Provide the training set, T, to train the virtual model 222

Generate predictive metrology data using the virtual model 224

Compare the predictive metrology data to actual (measured) metrology data 226

(56) References Cited

U.S. PATENT DOCUMENTS

| | | | | |
|---|---|---|---|---|
| 2005/0075750 | A1* | 4/2005 | Sun | H01L 22/20 700/121 |
| 2009/0325326 | A1* | 12/2009 | Park | G01J 4/00 356/369 |
| 2014/0031969 | A1* | 1/2014 | Baseman | G05B 13/048 700/121 |
| 2016/0148850 | A1* | 5/2016 | David | G03F 7/70633 355/53 |
| 2017/0005019 | A1* | 1/2017 | Wilby | H01L 21/67248 |
| 2017/0218860 | A1* | 8/2017 | Pachner | F02D 41/1462 |
| 2018/0356807 | A1* | 12/2018 | Honda | G05B 19/41885 |
| 2021/0191375 | A1* | 6/2021 | Ai | G05B 19/41885 |
| 2022/0092242 | A1* | 3/2022 | Shinagawa | G03F 7/70616 |
| 2022/0260978 | A1* | 8/2022 | Sin | G06N 20/00 |
| 2023/0195061 | A1* | 6/2023 | Gadre | G05B 13/0265 700/159 |
| 2023/0195071 | A1* | 6/2023 | Kazmierski | G05B 19/406 700/121 |

* cited by examiner

SYSTEMS AND METHODS FOR PREDICTING FILM THICKNESS USING VIRTUAL METROLOGY

TECHNICAL FIELD

The present disclosure relates to electrical components, and, more particularly, to predicting film thickness using virtual metrology.

BACKGROUND

Products may be produced by performing one or more manufacturing processes using manufacturing equipment. For example, semiconductor manufacturing equipment may be used to produce semiconductor devices (e.g., substrates, wafers, etc.) via semiconductor manufacturing processes. The manufacturing equipment can deposit a film on the surface of the substrate and can perform an etch process to form the intricate pattern in the deposited film. For example, the manufacturing equipment may perform a chemical vapor deposition (CVD) process to deposit a film on the substrate. Sensors may be used to determine manufacturing parameters of the manufacturing equipment during the manufacturing processes and metrology equipment may be used to determine property data of the products that were produced by the manufacturing equipment. Generally, the metrology equipment analyzes only a portion of a production run (e.g., two substrates from a batch of twenty-five) due to time and cost constraints. As such, metrology data is not generated for each substrate of the production run, which can result in undetected faulty substrates. Therefore, a system capable of generating cost and time efficient metrology data for all substrates of a production run is desirable.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, a method includes obtaining sensor data associated with a deposition process performed in a process chamber to deposit film on a surface of a substrate. The method further includes generating a plurality of physics based outputs using a transformation function and the sensor data. The method further includes mapping the physics based outputs to a training set. The method further includes training a virtual model based on the training set and the sensor data. The method further includes generating, using the virtual model, predictive metrology data associated with the film.

In another aspect of the disclosure, a system includes a memory; and a processing device, coupled to the memory, to obtain sensor data associated with a deposition process performed in a process chamber to deposit film on a surface of a substrate. The processing device is further to generate a plurality of physics based outputs using a transformation function and the sensor data. The processing device is further to map the physics based outputs to a training set. The processing device is further to train a virtual model based on the training set and the sensor data. The processing device is further to generate, using the virtual model, predictive metrology data associated with the film.

In another aspect of the disclosure, a non-transitory machine-readable storage medium storing instructions which, when executed cause a processing device to perform operations including obtaining sensor data associated with a deposition process performed in a process chamber to deposit film on a surface of a substrate. The operations further include generating a plurality of physics based outputs using a transformation function and the sensor data. The operations further include mapping the physics based outputs to a training set. The operations further include training a virtual model based on the training set and the sensor data. The operations further include generating, using the virtual model, predictive metrology data associated with the film.

BRIEF DESCRIPTION OF THE DRAWINGS

The present disclosure is illustrated by way of example, and not by way of limitation in the figures of the accompanying drawings.

DETAILED DESCRIPTION

Figure 1:
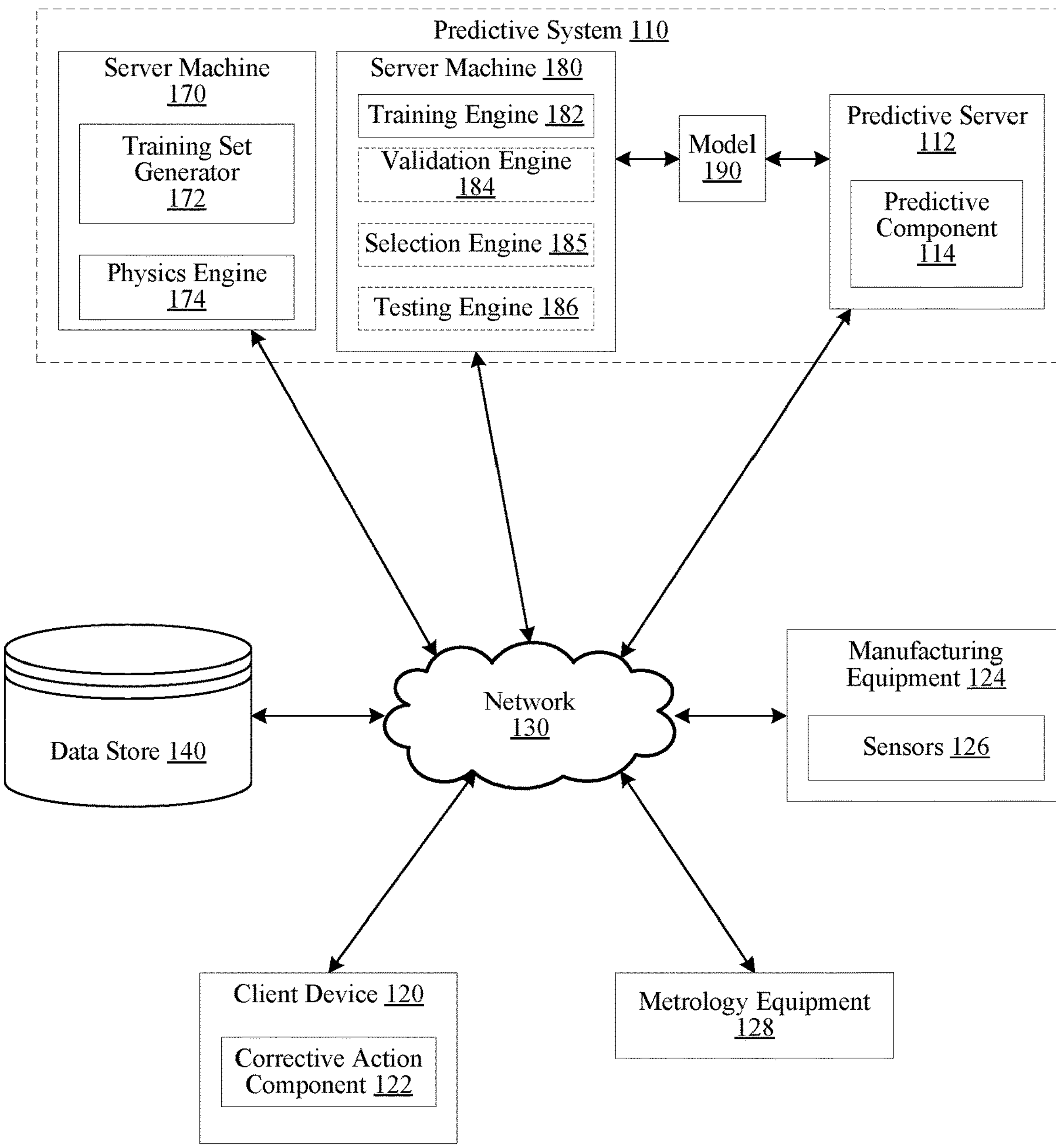
FIG. 1 is a block diagram illustrating an exemplary system architecture, according to certain embodiments.

Described herein are technologies directed to systems and methods for predicting film thickness using virtual metrology. A film can be deposited on a surface of a substrate during a deposition process performed at a process chamber of a manufacturing system. For example, in a chemical vapor deposition (CVD) process, the substrate is exposed to one or more precursors, which react on the substrate surface to produce the desired deposit. The film can include one or more layers of materials that are formed during the deposition process, and each layer can include a particular thickness gradient (e.g., changes in the thickness along a layer of the deposited film). For example, a first layer of material can be formed directly on the surface of the substrate (referred to as a proximal layer or proximal end of the film) and have a first thickness. After the first layer is formed on the surface of the substrate, a second layer of material of a second thickness can be formed on the first layer. This process continues until the deposition process is completed and a final layer is formed for the film (referred to as the distal layer or distal end of the film).

In some existing systems, metrology measurements are performed on multiple substrates of a batch. For example, metrology equipment can analyze a portion of a batch during a production run. However, this slows down the production time. In other existing systems, a purely statistics based model can be used. However, a purely statistics based model requires multiple virtual models for different target film thickness or requires a large dataset spanning many different film thicknesses.

Aspects and implementations of the present disclosure address these and other shortcoming of existing technology by using sensor data and a physics-based engine to generate training sets, which are input into a statistical virtual model to predict metrology data. In some embodiments, physics based outputs are generated by the physics engine using a transformation function and sensor data associated with the deposition process performed at the process chamber of the manufacturing system. The transformation function can be used to process non-linear relationships between sensor data from different sensors in the process chamber. The sensor data may be time-based (e.g., temperature readings every millisecond, pressure readings every millisecond, etc.). In some embodiments, the transformation function can include functions associated with chemical kinetics, the Langmuir adsorption model, and the Arrhenius Equation to compute a Maxwell distribution function for the process chamber, to estimate site availability for growth at equilibrium condition for the process chamber, and to estimate boundary layer thickness in an equilibrium condition for the process chamber. The physics based outputs can be mapped to the substrate of a training set, and fed to the virtual model.

In some embodiments, the virtual model can generate predictive output data used to predict metrology data of the substrate. The predictive metrology data can include a contour map (e.g., a vector map) including a set of spatial measurements (e.g., a set of vectors), each indicating a thickness of a particular location of a plurality of locations on a substrate. The predictive metrology data can be compared to actual (measured) metrology data of the substrate, which can be used to train or update the virtual model.

In some embodiments, a prediction server provides the ability for real-time prediction of metrology data for substrates using the virtual model. Since the virtual model can process non-linear effects caused by simultaneous changing of sensor parameters of multiple sensors, the prediction server allows a user to adjust multiple process chamber parameters to obtain the same desired film thickness. Furthermore, virtual model can be trained using substrates having firm of a first thickness, and predict metrology data for a film deposition process of a second thickness. This is due to the virtual model being trained on a training set which includes the physics based transformation function.

Aspects of the present disclosure result in technological advantages of significant reduction in time required to achieve optimal settings and process a substrate batch, as well as improvements in energy consumption, and so forth. The present disclosure results in reduced time requirements, dataset requirements, and avoids using multiple virtual models by using a physics based engine to train a single virtual model which can be used to obtain predictive data and cause performance of corrective actions based on the predictive data. The present disclosure can result in predicting optimal parameter settings in real-time for different target film thicknesses to avoid inconsistent and abnormal products, unscheduled user time, and unnecessary metrology measurements.

FIG. 1 depicts an illustrative computer system architecture 100, according to aspects of the present disclosure. In some embodiments, computer system architecture 100 can be included as part of a manufacturing system for processing substrates, such as manufacturing system 300 of FIG. 3. Computer system architecture 100 includes a client device 120, manufacturing equipment 124, metrology equipment 128, a predictive server 112 (e.g., to generate predictive data, to provide model adaptation, to use a knowledge base, etc.), and a data store 140. The predictive server 112 can be part of a predictive system 110. The predictive system 110 can further include server machines 170 and 180. The manufacturing equipment 124 can include sensors 126 configured to capture data for a substrate being processed at the manufacturing system. In some embodiments, the manufacturing equipment 124 and sensors 126 can be part of a sensor system that includes a sensor server (e.g., field service server (FSS) at a manufacturing facility) and sensor identifier reader (e.g., front opening unified pod (FOUP) radio frequency identification (RFID) reader for sensor system). In some embodiments, metrology equipment 128 can be part of a metrology system that includes a metrology server (e.g., a metrology database, metrology folders, etc.) and metrology identifier reader (e.g., FOUP RFID reader for metrology system).

Manufacturing equipment 124 can produce products, such as electronic devices, following a recipe or performing runs over a period of time. Manufacturing equipment 124 can include a process chamber, such as process chamber 400 described with respect to FIG. 4. Manufacturing equipment 124 can perform a process for a substrate (e.g., a wafer, etc.) at the process chamber. Examples of substrate processes include a deposition process to deposit a film on a surface of the substrate, an etch process to form a pattern on the surface of the substrate, etc. Manufacturing equipment 124 can perform each process according to a process recipe. A process recipe defines a particular set of operations to be performed for the substrate during the process and can include one or more settings associated with each operation. For example, a deposition process recipe can include a temperature setting for the process chamber, a pressure setting for the process chamber, a flow rate setting for a precursor for a material included in the film deposited on the substrate surface, etc.

In some embodiments, manufacturing equipment 124 can include sensors 126 that are configured to generate data associated with a substrate processed at manufacturing system 100. For example, a process chamber can include one or more sensors configured to generate spectral or non-spectral data associated with the substrate before, during, and/or after a process (e.g., a deposition process) is performed for the substrate. In some embodiments, spectral data generated by sensors 126 can indicate a concentration of one or more materials deposited on a surface of a substrate. Sensors 126 configured to generate spectral data associated with a substrate can include reflectometry sensors, ellipsometry sensors, thermal spectra sensors, capacitive sensors, and so forth. Sensors 126 configured to generate non-spectral data associated with a substrate can include temperature sensors, pressure sensors, flow rate sensors, voltage sensors, etc. Further details regarding manufacturing equipment 124 are provided with respect to FIG. 3 and FIG. 4.

In some embodiments, sensors 126 can provide sensor data (e.g., sensor values, features, trace data) associated with manufacturing equipment 124 (e.g., associated with producing, by manufacturing equipment 124, corresponding products, such as wafers). The manufacturing equipment 124 may produce products following a recipe or performing runs over a period of time. Sensor data received over a period of time (e.g., corresponding to at least part of a recipe or run) may be referred to as trace data (e.g., historical trace data, current trace data, etc.) received from different sensors 126 over time. Sensor data can include a value of one or more of temperature (e.g., heater temperature), spacing (SP), pressure, high frequency radio frequency (HFRF), voltage of electrostatic chuck (ESC), electrical current, material flow, power, voltage, etc. Sensor data can be associated with or indicative of manufacturing parameters such as hardware parameters, such as settings or components (e.g., size, type, etc.) of the manufacturing equipment 124, or process parameters of the manufacturing equipment 124. The sensor data can be provided while the manufacturing equipment 124 is performing manufacturing processes (e.g., equipment readings when processing products). The sensor data can be different for each substrate.

Metrology equipment 128 can provide metrology data associated with substrates processed by manufacturing equipment 124. The metrology data can include a value of film property data (e.g., wafer spatial film properties), dimensions (e.g., thickness, height, etc.), dielectric constant, dopant concentration, density, defects, etc. In some embodiments, the metrology data can further include a value of one or more surface profile property data (e.g., an etch rate, an etch rate uniformity, a critical dimension of one or more features included on a surface of the substrate, a critical dimension uniformity across the surface of the substrate, an edge placement error, etc.). The metrology data can be of a finished or semi-finished product. The metrology data can be different for each substrate.

In some embodiments, metrology equipment 128 can be included as part of the manufacturing equipment 124. For example, metrology equipment 128 can be included inside of or coupled to a process chamber and configured to generate metrology data for a substrate before, during, and/or after a process (e.g., a deposition process, an etch process, etc.) while the substrate remains in the process chamber. In such instances, metrology equipment 128 can be referred to as in-situ metrology equipment. In another example, metrology equipment 128 can be coupled to another station of manufacturing equipment 124. For example, metrology equipment can be coupled to a transfer chamber, such as transfer chamber 310 of FIG. 3, a load lock, such as load lock 320, or a factory interface, such as factory interface 306. In such instances, metrology equipment 128 can be referred to as integrated metrology equipment. In other or similar embodiments, metrology equipment 128 is not coupled to a station of manufacturing equipment 124. In such instances, metrology equipment 128 can be referred to as inline metrology equipment or external metrology equipment. In some embodiments, integrated metrology equipment and/or inline metrology equipment are configured to generate metrology data for a substrate before and/or after a process.

The client device 120 my include a computing device such as personal computers (PCs), laptops, mobile phones, smart phones, tablet computers, netbook computers, network connected televisions ("smart TVs"), network-connected media players (e.g., Blu-ray player), a set-top box, over-the-top (OTT) streaming devices, operator boxes, etc. In some embodiments, the metrology data can be received from the client device 120. Client device 120 can display a graphical user interface (GUI), where the GUI enables the user to provide, as input, metrology measurement values for substrates processed at the manufacturing system.

Data store 140 can be a memory (e.g., random access memory), a drive (e.g., a hard drive, a flash drive), a database system, or another type of component or device capable of storing data. Data store 140 can include multiple storage components (e.g., multiple drives or multiple databases) that can span multiple computing devices (e.g., multiple server computers). The data store 140 can store data associated with processing a substrate at manufacturing equipment 124. For example, data store 140 can store data collected by sensors 126 at manufacturing equipment 124 before, during, or after a substrate process (referred to as process data). Process data can refer to historical process data (e.g., process data generated for a prior substrate processed at the manufacturing system) and/or current process data (e.g., process data generated for a current substrate processed at the manufacturing system). Data store can also store spectral data or non-spectral data associated with a portion of a substrate processed at manufacturing equipment 124. Spectral data can include historical spectral data and/or current spectral data.

In some embodiments, data store 140 can also store thickness profile data associated with a film deposited on a surface of a substrate. As described previously, a thickness profile refers to a particular thickness gradient of the deposited film (e.g., changes in the thickness along a layer of deposited film). In some embodiments, thickness profile data can include a thickness of a film deposited on a surface of a substrate (e.g., as determined by metrology inspection or as determined by prediction). In some embodiments, thickness profile data can indication of a rate of change of the concentration of the particular material of one or more film layers. For example, thickness profile data can include an indication of linear rate of change (e.g., a constant rate of change) or a non-linear rate of change (e.g., a non-constant rate of change) of the concentration of the particular material in the layers between the proximal and distal layers of the deposited film. In some embodiments, thickness profile data can be provided by a user (e.g., an operator) of the manufacturing system (e.g., via client device 120). In other or similar embodiments, thickness profile data can be determined by a processing device of the manufacturing system, (e.g., system controller 328 of FIG. 3) based on sensor data and/or metrology data stored at the data store 140. Thickness profile data can refer to historical thickness profile data (e.g., concentration profile data for a prior film deposited on a prior substrate) or current thickness profile data (e.g., concentration profile data for a current film deposited on a current substrate).

In some embodiments, thickness profile data can also include data associated with a target thickness profile for a film to be deposited on a surface of a substrate. For example, a user of the operating system (e.g., an operator) can provide data associated with a target concentration profile via client device 120. The data associated with the target thickness profile can include at least of a target thickness of the film to be deposited on the surface of the substrate, a target initial thickness of a particular material of the film (e.g., a thickness of the particular material at a proximal layer of the film, and a target final thickness of the particular material of the film (e.g., a thickness of the particular material at the distal layer of the film). In some embodiments, the data associated with the target thickness can also include an indication of a target rate of change (e.g., linear, non-linear, etc.) of the thickness gradient for the particular material within the layers between the proximal and distal layers of the film.

The data store 140 can also store contextual data associated with one or more substrates processed at the manufacturing system. Contextual data can include a recipe name, recipe step number, preventive maintenance indicator, operator, etc. Contextual data can refer to historical contextual data (e.g., contextual data associated with a prior process performed for a prior substrate) and/or current process data (e.g., contextual data associated with current process or a future process to be performed for a prior substrate). In some embodiments, contextual data can also include an indication of one or more settings associated with a particular process. For example, contextual data for a deposition process can include a temperature setting for a process chamber, a pressure setting for a process chamber, a flow rate setting for a precursor for a material of a film deposited on a substrate, etc.

In some embodiments, data store 140 can be configured to store data that is not accessible to a user of the manufacturing system. For example, process data, spectral data, contextual data, etc. obtained for a substrate being processed at the manufacturing system is not accessible to a user (e.g., an operator) of the manufacturing system. In some embodiments, all data stored at data store 140 can be inaccessible by the user of the manufacturing system. In other or similar embodiments, a portion of data stored at data store 140 can be inaccessible by the user while another portion of data stored at data store 140 can be accessible by the user. In some embodiments, one or more portions of data stored at data store 140 can be encrypted using an encryption mechanism that is unknown to the user (e.g., data is encrypted using a private encryption key). In other or similar embodiments, data store 140 can include multiple data stores where data that is inaccessible to the user is stored in one or more first data stores and data that is accessible to the user is stored in one or more second data stores.

In some embodiments, predictive system 110 includes predictive server 112, server machine 170 and server machine 180. The predictive server 112, server machine 170, and server machine 180 may each include one or more computing devices such as a rackmount server, a router computer, a server computer, a personal computer, a mainframe computer, a laptop computer, a tablet computer, a desktop computer, Graphics Processing Unit (GPU), accelerator Application-Specific Integrated Circuit (ASIC) (e.g., Tensor Processing Unit (TPU)), etc.

Server machine 170 includes a training set generator 172 and a physics engine 174 that is capable of generating training data sets (e.g., a set of data inputs and a set of target outputs) to train, validate, and/or test a virtual model 190. Virtual model 190 can be a statistics based virtual model, a machine learning model, or any other algorithmic model capable of learning from data.

Some operations of data set generator 172 and physics engine 174 are described in detail below with respect to FIG. 2. In some embodiments, the data set generator 172 can partition the training data into a training set, a validating set, and a testing set. In some embodiments, the physics engine 174 generate one or more physics based outputs using a transformation function and sensor data. The transformation function can be used to process non-linear relationships between sensor data from different sensors in a process chamber (e.g., process chamber 400). In some embodiments, the transformation function can include functions associated with chemical kinetics (e.g., reaction kinetics), the Langmuir adsorption model (e.g., Langmuir Isotherm), the Arrhenius Equation, etc. In some embodiments, transformation function can be used to compute a Maxwell distribution function for the process chamber, to estimate site availability for growth at equilibrium condition for the process chamber, to estimate boundary layer thickness in an equilibrium condition for the process chamber, or to determine or estimate any other process chamber configuration conditions. In some embodiments, data set generator 172 and physics engine 174 can be a single component or multiple components. In some embodiments, the predictive system 110 generates multiple sets of training data.

Server machine 180 can include a training engine 182, a validation engine 184, a selection engine 185, and/or a testing engine 186. An engine can refer to hardware (e.g., circuitry, dedicated logic, programmable logic, microcode, processing device, etc.), software (such as instructions run on a processing device, a general purpose computer system, or a dedicated machine), firmware, microcode, or a combination thereof. Training engine 182 can be capable of training one or more virtual models 190. Virtual model 190 can refer to the model artifact that is created by the training engine 182 using the training data (also referred to herein as a training set) that includes training inputs and corresponding target outputs (correct answers for respective training inputs). The training engine 182 can find patterns in the training data that map the training input to the target output (the answer to be predicted), and provide the virtual model 190 that captures these patterns. The virtual model 190 can use one or more of a statistical modelling, support vector machine (SVM), Radial Basis Function (RBF), clustering, supervised machine learning, semi-supervised machine learning, unsupervised machine learning, k-nearest neighbor algorithm (k-NN), linear regression, random forest, neural network (e.g., artificial neural network), etc.

The validation engine 184 can be capable of validating virtual model 190 using a corresponding set of features of a validation set from training set generator 172. The validation engine 184 can determine an accuracy of virtual model 190 based on the corresponding sets of features of the validation set. The validation engine 184 can discard a trained virtual model 190 that has an accuracy that does not meet a threshold accuracy. In some embodiments, the selection engine 185 can be capable of selecting a trained virtual model 190 that has an accuracy that meets a threshold accuracy. In some embodiments, the selection engine 185 can be capable of selecting the trained virtual model 190 that has the highest accuracy of the trained virtual models 190.

The testing engine 186 can be capable of testing a trained virtual model 190 using a corresponding set of features of a testing set from data set generator 172. For example, a first trained virtual model 190 that was trained using a first set of features of the training set can be tested using the first set of features of the testing set. The testing engine 186 can determine a trained virtual model 190 that has the highest accuracy of all of the trained virtual models based on the testing sets.

As described in detail below, predictive server 112 includes a predictive component 114 that is capable of providing data associated with a thickness profile for a film deposited on a surface of a substrate during a deposition process for the substrate and running trained virtual model 190 on the input to obtain one or more outputs. The predictive server 112 can further provide real-time or near real-time metrology predictions for wafers undergoing the deposition process. This will be explained in further detail below.

The client device 120, manufacturing equipment 124, sensors 126, metrology equipment 128, predictive server 112, data store 140, server machine 170, and server machine 180 can be coupled to each other via a network 130. In some embodiments, network 130 is a public network that provides client device 120 with access to predictive server 112, data store 140, and other publically available computing devices. In some embodiments, network 130 is a private network that provides client device 120 access to manufacturing equipment 124, metrology equipment 128, data store 140, and other privately available computing devices. Network 130 can include one or more wide area networks (WANs), local area networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

It should be noted that in some other implementations, the functions of server machines 170 and 180, as well as predictive server 112, can be provided by a fewer number of machines. For example, in some embodiments, server machines 170 and 180 can be integrated into a single machine, while in some other or similar embodiments, server machines 170 and 180, as well as predictive server 112, can be integrated into a single machine.

In general, functions described in one implementation as being performed by server machine 170, server machine 180, and/or predictive server 112 can also be performed on client device 120. In addition, the functionality attributed to a particular component can be performed by different or multiple components operating together.

In embodiments, a "user" can be represented as a single individual. However, other embodiments of the disclosure encompass a "user" being an entity controlled by a plurality of users and/or an automated source. For example, a set of individual users federated as a group of administrators can be considered a "user."

Figure 2:
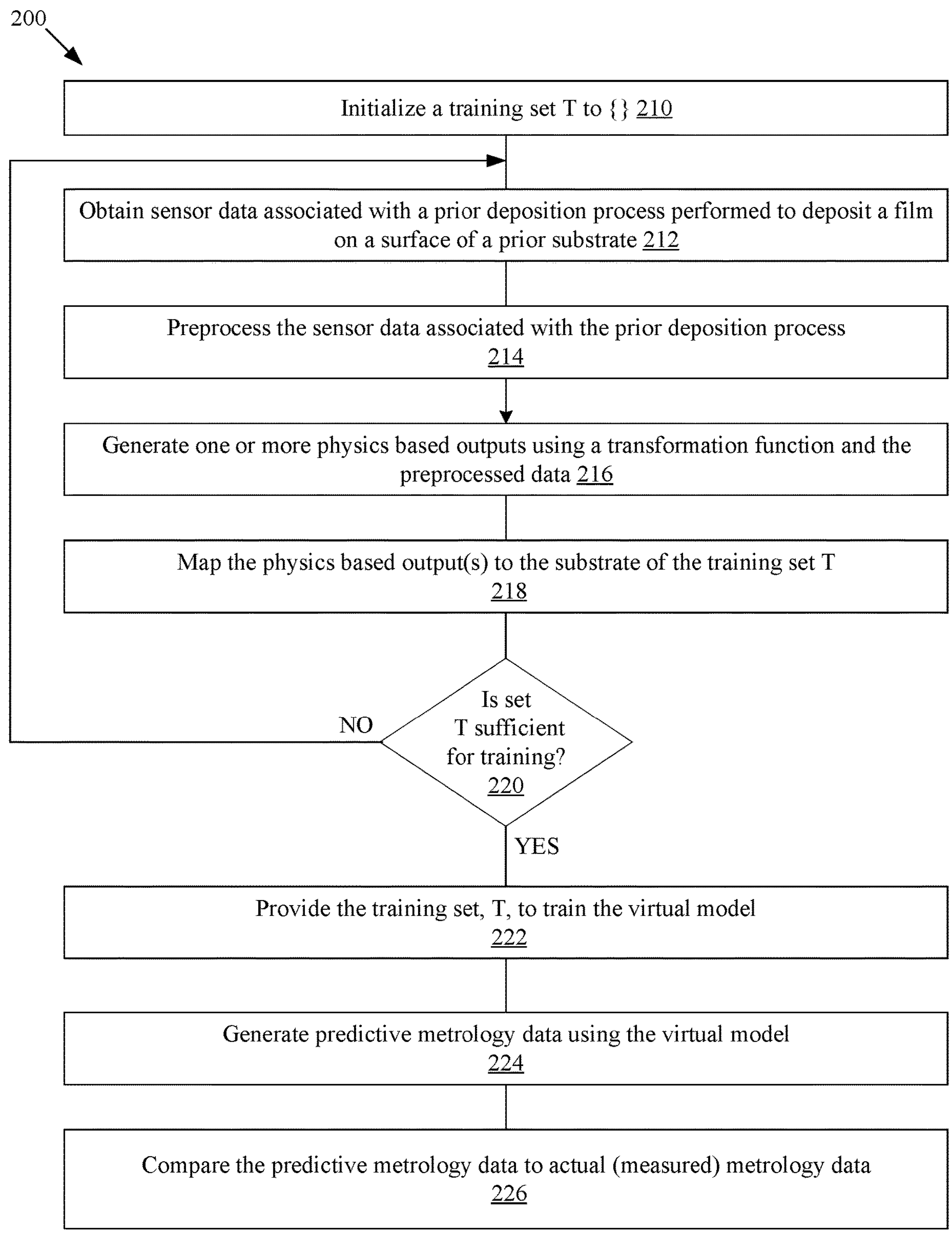
FIG. 2 is a flow diagram of a method for training a virtual model, according to certain embodiments.

FIG. 2 is a flow chart of a method 200 for training a virtual model, according to aspects of the present disclosure. Method 200 is performed by processing logic that can include hardware (circuitry, dedicated logic, etc.), software (such as is run on a general purpose computer system or a dedicated machine), firmware, or some combination thereof. In one implementation, method 200 can be performed by a computer system, such as computer system architecture 100 of FIG. 1. In other or similar implementations, one or more operations of method 200 can be performed by one or more other machines not depicted in the figures. In some aspects, one or more operations of method 200 can be performed by server machine 170, server machine 180, and/or predictive server 112.

For simplicity of explanation, the methods are depicted and described as a series of acts. However, acts in accordance with this disclosure can occur in various orders and/or concurrently, and with other acts not presented and described herein. Furthermore, not all illustrated acts can be performed to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term article of manufacture, as used herein, is intended to encompass a computer program accessible from any computer-readable device or storage media.

At block 210, processing logic initializes a training set T to an empty set (e.g., { }). At block 212, processing logic obtains sensor data (e.g., sensor values, features, trace data) associated with a prior deposition process performed to deposit a film on a surface of a prior substrate. In some embodiments, the sensor data associated with the deposition process is historical data associated with one or more prior deposition settings for a prior deposition process previously performed for a prior substrate at a manufacturing system. For example, the historical data can be historical contextual data associated with the prior deposition process stored at data store 140. In some embodiments, the one or more prior deposition settings can include at least one of a prior temperature setting for the prior deposition process, a prior pressure setting for the prior deposition setting, a prior flow rate setting for a precursor for one or more material of the prior film deposited on the surface of the prior substrate, or any other setting associated with the deposition process. A flow rate setting can refer to a flow rate setting for the precursor at an initial instance of the prior deposition process (referred to as an initial flow rate setting), a flow rate setting for the precursor at a final instance of the prior deposition process (referred to as a final flow rate setting), or a ramping rate for the flow rate of the precursor during the deposition process. In one example, the precursor for the prior film can include a boron-containing precursor or a silicon-containing precursor.

At block 214, processing logic preprocesses the sensor data associated with the prior deposition processes. In some embodiments, the processing logic can preprocess the sensor data by computing step averages of sensor values from trace data. The step averages can be determined for the duration of each deposition process. For example, if a deposition process starting time is at the $45^{th}$ second and the deposition process ends at the $90^{th}$ second, the deposition step duration for this deposition process is 45 seconds and preprocessed data for the deposition step will only be computed using the sensor data recorded from $45^{th}$ second to $90^{th}$ second.

At block 216, processing logic generate one or more physics based outputs using a transformation function and the preprocessed data. The transformation function can be used to process non-linear relationships between sensor data from different sensors in a process chamber (e.g., process chamber 400). In some embodiments, the transformation function can include functions associated with chemical kinetics (e.g., reaction kinetics), the Langmuir adsorption model (e.g., Langmuir Isotherm), the Arrhenius Equation, etc. In some embodiments, transformation function can be used to compute a Maxwell distribution function for the process chamber, to estimate site availability for growth at equilibrium condition for the process chamber, to estimate boundary layer thickness in an equilibrium condition for the process chamber, or to determine or estimate any other process chamber configuration conditions. By ways of example, the physics based outputs can include a Maxwell distribution function, a growth estimate function, and a boundary layer thickness distribution function.

At block 218, processing logic maps the physics based output(s) to the substrate of the training set, T. For example, processing logic can map the Maxwell distribution function, the growth estimate function, and the boundary layer thickness distribution function to the substrate of the training set, T. The training set, T, can generate output values.

At block 220, processing logic determines whether the training set, T, includes a sufficient amount of training data to train a virtual model. In some embodiments, the virtual model is a statistics based virtual model, a machine learning model, etc. It should be noted that in some implementations, the sufficiency of training set T can be determined based simply on the number of mappings in the training set, while in some other implementations, the sufficiency of training set T can be determined based on one or more other criteria (e.g., a measure of diversity of the training examples, etc.) in addition to, or instead of, the number of input/output mappings. Responsive to determining the training set does not include a sufficient amount of training data to train the virtual model, method 200 returns to block 212. Responsive to determining the training set, T, includes a sufficient amount of training data to train the virtual model, method 200 continues to block 222.

At block 222, processing logic provides the training set, T, to train the virtual model. In one implementation, the training set, T, is provided to training engine 182 of server machine 180 to perform the training. In the case of a statistics based virtual model, for example, output values generated by the training set can be integrated, along with sensor data (e.g., sensor values), as input to the virtual model. The virtual model can then generate predictive output data (e.g., $J_1, J_2 \ldots J_n$) for each location on the substrate.

At block 224, processing logic generates predictive metrology data using the virtual model. For example, processing logic can generate predictive metrology data using the predictive output data (e.g., $J_1, J_2 \ldots J_n$) to compute metrology data for the substrate(s) of the training set(s). In some embodiments, the predictive metrology data can include a contour map (e.g., a vector map) including a set of spatial measurements (e.g., a set of vectors), each indicating a thickness of a particular location of a plurality of locations on each substrate. In some embodiments, the predictive metrology data can indicate an average predictive film thickness. At block 226, processing logic compares the predictive metrology data to actual (measured) metrology data. The comparisons can be used to further train or refine the virtual model.

After block 226, virtual model 190 can be used to predict, for a deposition process to be performed for a current substrate, which set of deposition settings for the deposition process corresponds to a target thickness profile for a film to be deposited on a surface of the current substrate. In some embodiments, the predictive component 114 and/or the corrective action component 112 can adjust one or more parameters of a deposition process recipe (e.g., a temperature setting for the process chamber, a pressure setting for the process chamber, a flow rate setting for a precursor for a material included in the film deposited on the substrate surface, etc.) based on a desired target thickness profile for the film. In some embodiments, the deposition process recipe can be adjusted before, during (e.g., in real time) or after the deposition process.

Figure 3:
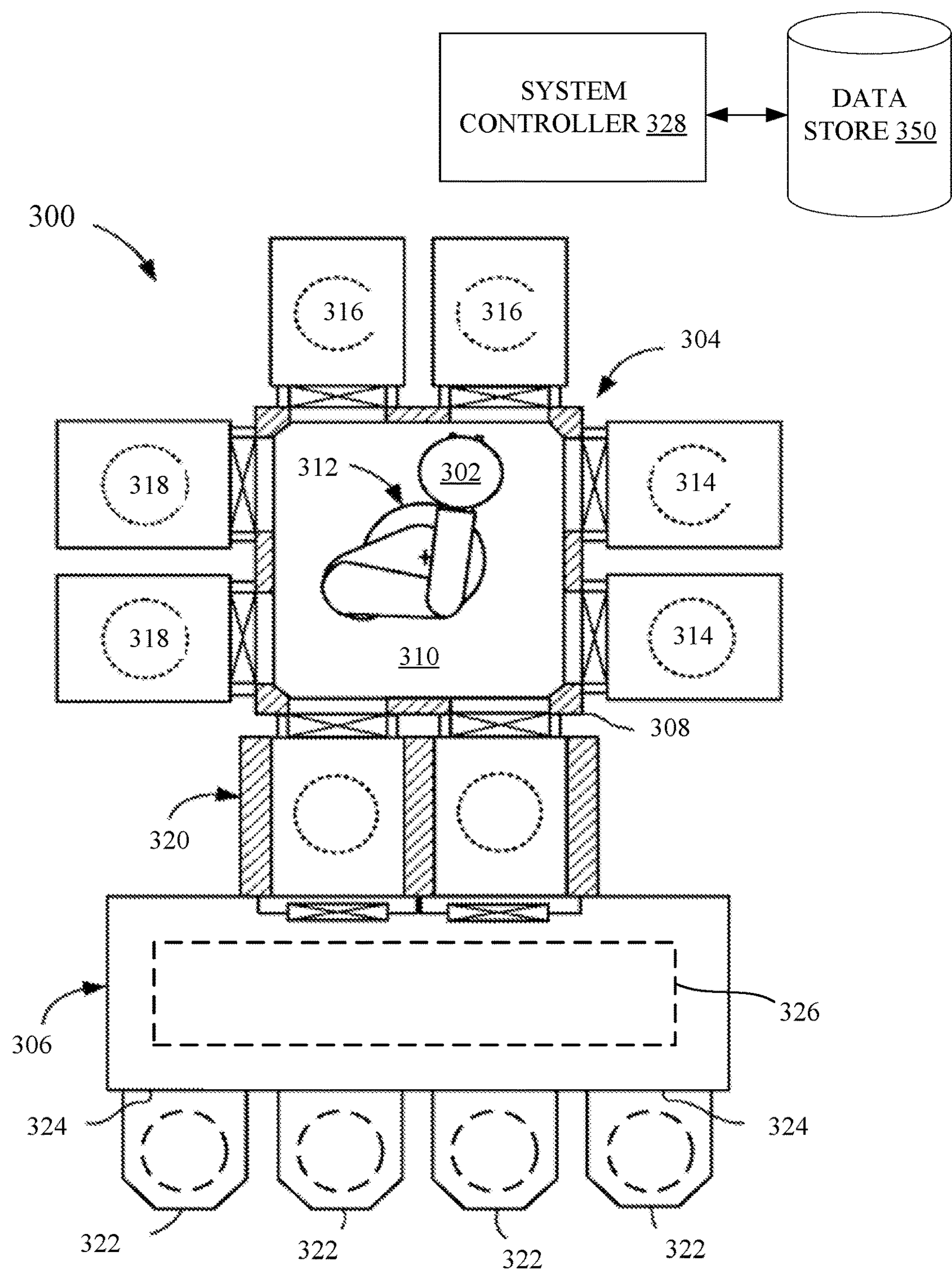
FIG. 3 is a top schematic view of an example manufacturing system, according to certain embodiments.

In some embodiments, a manufacturing system can include more than one process chambers. For example, example manufacturing system 300 of FIG. 3 illustrates multiple process chambers 314, 316, 318. It should be noted that, in some embodiments, data obtained to train the virtual model and data collected to be provided as input to the virtual model can be associated with the same process chamber of the manufacturing system. In other or similar embodiments, data obtained to train the virtual model and data collected to be provided as input to the virtual model can be associated with different process chambers of the manufacturing system. In other or similar embodiments, data obtained to train the virtual model can be associated with a process chamber of a first manufacturing system and data collected to be provide as input to the virtual model can be associated with a process chamber of a second manufacturing system.

FIG. 3 is a top schematic view of an example manufacturing system 300, according to aspects of the present disclosure. Manufacturing system 300 can perform one or more processes on a substrate 302. Substrate 302 can be any suitably rigid, fixed-dimension, planar article, such as, e.g., a silicon-containing disc or wafer, a patterned wafer, a glass plate, or the like, suitable for fabricating electronic devices or circuit components thereon.

Manufacturing system 300 can include a process tool 304 and a factory interface 306 coupled to process tool 304. Process tool 304 can include a housing 308 having a transfer chamber 310 therein. Transfer chamber 310 can include one or more process chambers (also referred to as processing chambers) 314, 316, 318 disposed therearound and coupled thereto. Process chambers 314, 316, 318 can be coupled to transfer chamber 310 through respective ports, such as slit valves or the like. Transfer chamber 310 can also include a transfer chamber robot 312 configured to transfer substrate 302 between process chambers 314, 316, 318, load lock 320, etc. Transfer chamber robot 312 can include one or multiple arms where each arm includes one or more end effectors at the end of each arm. The end effector can be configured to handle particular objects, such as wafers.

Process chambers 314, 316, 318 can be adapted to carry out any number of processes on substrates 302. A same or different substrate process can take place in each processing chamber 314, 316, 318. A substrate process can include atomic layer deposition (ALD), physical vapor deposition (PVD), chemical vapor deposition (CVD), etching, annealing, curing, pre-cleaning, metal or metal oxide removal, or the like. Other processes can be carried out on substrates therein. Process chambers 314, 316, 318 can each include one or more sensors configured to capture data for substrate 302 before, after, or during a substrate process. For example, the one or more sensors can be configured to capture spectral data and/or non-spectral data for a portion of substrate 302 during a substrate process. In other or similar embodiments, the one or more sensors can be configured to capture data associated with the environment within process chamber 314, 316, 318 before, after, or during the substrate process. For example, the one or more sensors can be configured to capture data associated with a temperature, a pressure, a gas concentration, etc. of the environment within process chamber 314, 316, 318 during the substrate process.

A load lock 320 can also be coupled to housing 308 and transfer chamber 310. Load lock 320 can be configured to interface with, and be coupled to, transfer chamber 310 on one side and factory interface 306. Load lock 320 can have an environmentally-controlled atmosphere that can be changed from a vacuum environment (wherein substrates can be transferred to and from transfer chamber 310) to an at or near atmospheric-pressure inert-gas environment (wherein substrates can be transferred to and from factory interface 306) in some embodiments. Factory interface 306 can be any suitable enclosure, such as, e.g., an Equipment Front End Module (EFEM). Factory interface 306 can be configured to receive substrates 302 from substrate carriers 322 (e.g., Front Opening Unified Pods (FOUPs)) docked at various load ports 324 of factory interface 306. A factory interface robot 326 (shown dotted) can be configured to transfer substrates 302 between carriers (also referred to as containers) 322 and load lock 320. Carriers 322 can be a substrate storage carrier or a replacement part storage carrier.

Manufacturing system 300 can also be connected to a client device (not shown) that is configured to provide information regarding manufacturing system 300 to a user (e.g., an operator). In some embodiments, the client device can provide information to a user of manufacturing system 300 via one or more graphical user interfaces (GUIs). For example, the client device can provide information regarding a target thickness profile for a film to be deposited on a surface of a substrate 302 during a deposition process performed at a process chamber 314, 316, 318 via a GUI. The client device can also provide information regarding a modification to a process recipe in view of a respective set of deposition settings predicted to correspond to the target profile, in accordance with embodiments described herein.

Manufacturing system 300 can also include a system controller 328. System controller 328 can be and/or include a computing device such as a personal computer, a server computer, a programmable logic controller (PLC), a microcontroller, and so on. System controller 328 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 328 can include a data storage device (e.g., one or more disk drives and/or solid state drives), a main memory, a static memory, a network interface, and/or other components. System controller 328 can execute instructions to perform any one or more of the methodologies and/or embodiments described herein. In some embodiments, system controller 328 can execute instructions to perform one or more operations at manufacturing system 300 in accordance with a process recipe. The instructions can be stored on a computer readable storage medium, which can include the main memory, static memory, secondary storage and/or processing device (during execution of the instructions).

System controller 328 can receive data from sensors included on or within various portions of manufacturing system 300 (e.g., processing chambers 314, 316, 318, transfer chamber 310, load lock 320, etc.). In some embodiments, data received by the system controller 328 can include spectral data and/or non-spectral data for a portion of substrate 302. In other or similar embodiments, data received by the system controller 328 can include data associated with processing substrate 302 at processing chamber 314, 316, 318, as described previously. For purposes of the present description, system controller 328 is described as receiving data from sensors included within process chambers 314, 316, 318. However, system controller 328 can receive data from any portion of manufacturing system 300 and can use data received from the portion in accordance with embodiments described herein. In an illustrative example, system controller 328 can receive data from one or more sensors for process chamber 314, 316, 318 before, after, or during a substrate process at the process chamber 314, 316, 318. Data received from sensors of the various portions of manufacturing system 300 can be stored in a data store 350. Data store 350 can be included as a component within system controller 328 or can be a separate component from system controller 328. In some embodiments, data store 350 can be data store 140 described with respect to FIG. 1.

Figure 4:
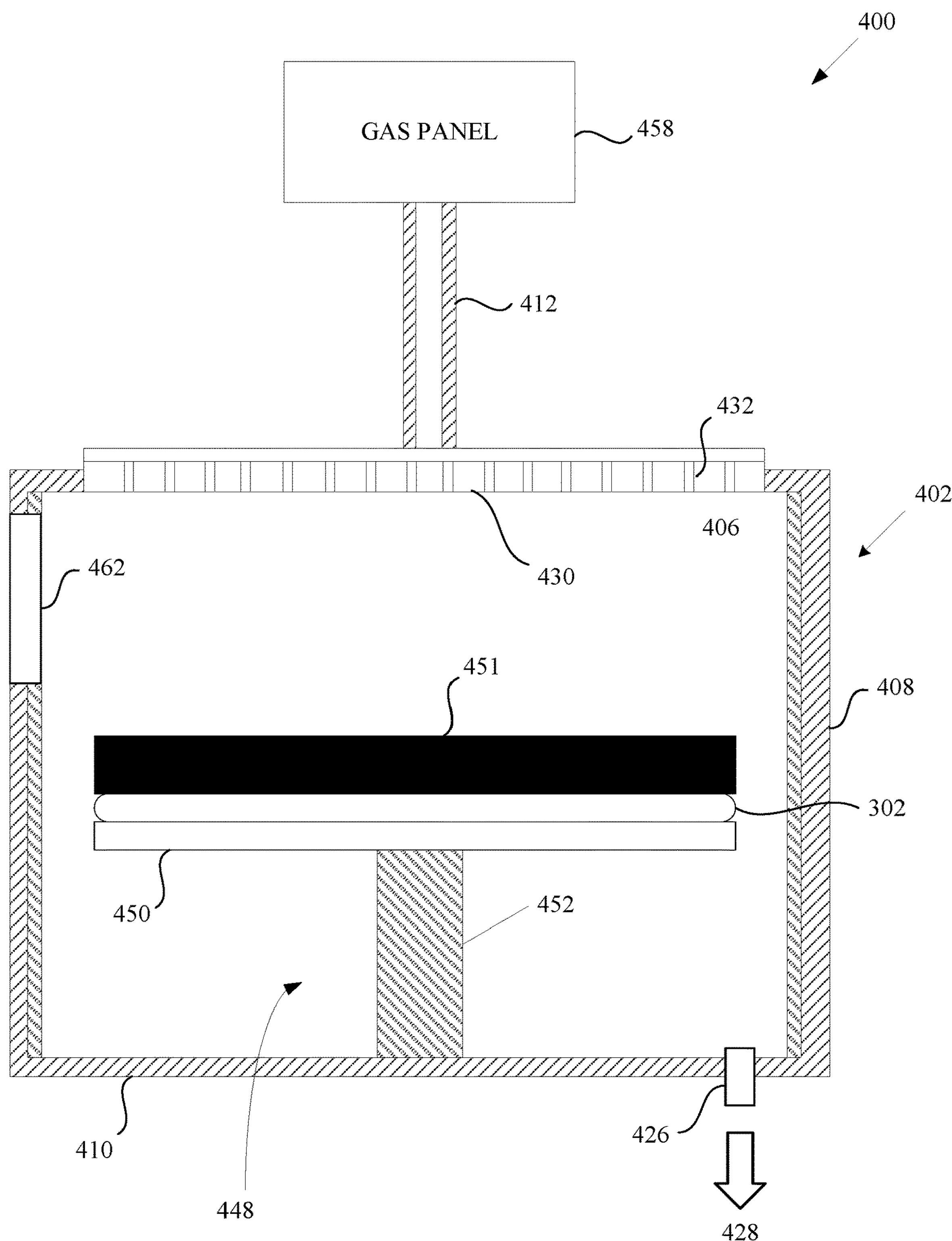
FIG. 4 is a cross-sectional schematic side view of an example process chamber of the example manufacturing system, according to certain embodiments.

FIG. 4 is a cross-sectional schematic side view of a process chamber 400, in accordance with embodiments of the present disclosure. In some embodiments, process chamber 400 can correspond to process chamber 314, 316, 318, described with respect to FIG. 3. Process chamber 400 can be used for processes in which a corrosive plasma environment is provided. For example, the process chamber 400 can be a chamber for a plasma etcher or plasma etch reactor, and so forth. In another example, process chamber can be a chamber for a deposition process, as previously described. In one embodiment, the process chamber 400 includes a chamber body 402 and a showerhead 430 that encloses an interior volume 406. The showerhead 430 can include a showerhead base and a showerhead gas distribution plate. Alternatively, the showerhead 430 can be replaced by a lid and a nozzle in some embodiments, or by multiple pie shaped showerhead compartments and plasma generation units in other embodiments. The chamber body 402 can be fabricated from aluminum, stainless steel or other suitable material such as titanium (Ti). The chamber body 402 generally includes sidewalls 408 and a bottom 410. An exhaust port 426 can be defined in the chamber body 402, and can couple the interior volume 406 to a pump system 428. The pump system 428 can include one or more pumps and throttle valves utilized to evacuate and regulate the pressure of the interior volume 406 of the process chamber 400.

The showerhead 430 can be supported on the sidewall 408 of the chamber body 402. The showerhead 420 (or lid) can be opened to allow access to the interior volume 406 of the process chamber 400, and can provide a seal for the process chamber 400 while closed. A gas panel 458 can be coupled to the process chamber 400 to provide process and/or cleaning gases to the interior volume 406 through the showerhead 430 or lid and nozzle (e.g., through apertures of the showerhead or lid and nozzle). For example. gas panel 458 can provide precursors for materials of a film 451 deposited on a surface of a substrate 302. In some embodiments, a precursor can include a silicon-based precursor or a boron-based precursor. The showerhead 430 can include a gas distribution plate (GDP) and can have multiple gas delivery holes 432 (also referred to as channels) throughout the GDP. A substrate support assembly 448 is disposed in the interior volume 406 of the process chamber 400 below the showerhead 430. The substrate support assembly 448 holds a substrate 302 during processing (e.g., during a deposition process).

In some embodiments, processing chamber 400 can include metrology equipment (not shown) configured to generate in-situ metrology measurements during a process performed at process chamber 400. The metrology equipment can be operatively coupled to the system controller (e.g., system controller 328, as previously described). In some embodiments, the metrology equipment can be configured to generate a metrology measurement value (e.g., a thickness) for film 451 during particular instances of the deposition process. The system controller can generate a thickness profile for film 451 based on the received metrology measurement values from the metrology equipment. In other or similar embodiments, processing chamber 400 does not include metrology equipment. In such embodiments, the system controller can receive one or more metrology measurement values for film 451 after completion of the deposition process at process chamber 400. System controller can determine a deposition rate based on the one or more metrology measurement values and can associate generate the thickness profile for film 451 based on the determined concentration gradient and the determined deposition rate of the deposition process.

Figure 5:
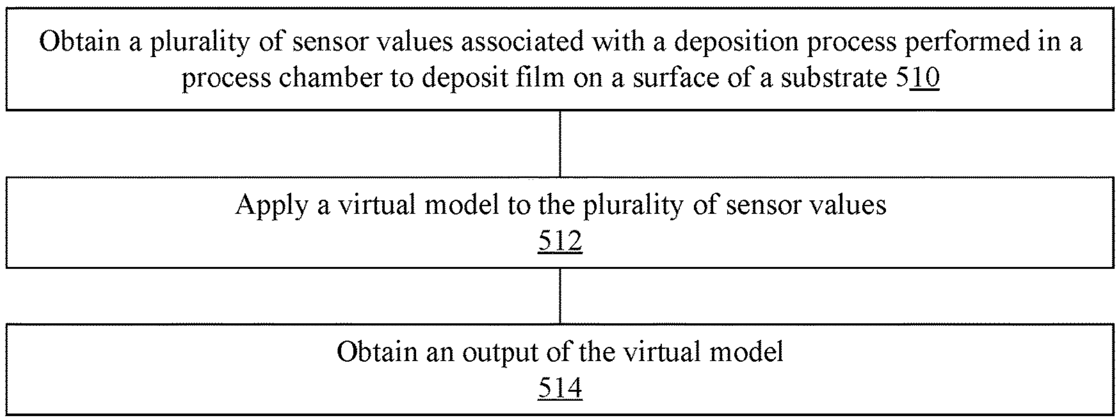
FIG. 5 is a flow diagram of a method for identifying predictive metrology data for a film using a virtual model, according to certain embodiments.

FIG. 5 is a flow chart of a method 500 for identifying predictive metrology data for a film using a virtual model, according to aspects of the present disclosure. Method 500 is performed by processing logic that can include hardware (circuitry, dedicated logic, etc.), software (such as is run on a general purpose computer system or a dedicated machine), firmware, or some combination thereof. In one implementation, method 500 can be performed by a computer system, such as computer system architecture 100 of FIG. 1. In other or similar implementations, one or more operations of method 500 can be performed by one or more other machines not depicted in the figures. In some aspects, one or more operations of method 500 can be performed by server machine 170, server machine 180, and/or predictive server 112.

At block 510, processing logic obtains a plurality of sensor values associated with a deposition process performed in a process chamber to deposit film on a surface of a substrate. At block 512, processing logic applies a virtual model to the plurality of sensor values. In some embodiments, the virtual model is trained based on historical sensor data and a plurality of physics based outputs used to process non-linear relationships between the historical sensor data from different sensors in a process chamber. In some embodiments, the plurality of physics based outputs are generated using a transformation function and the historical sensor data. In some embodiments, the transformation function can include functions associated with chemical kinetics (e.g., reaction kinetics), the Langmuir adsorption model (e.g., Langmuir Isotherm), the Arrhenius Equation, etc. In some embodiments, transformation function can be used to compute a Maxwell distribution function for the process chamber, to estimate site availability for growth at equilibrium condition for the process chamber, to estimate boundary layer thickness in an equilibrium condition for the process chamber, or to determine or estimate any other process chamber configuration conditions.

At block 514, processing logic obtains an output of the virtual model. For example, the output can identify predictive metrology data for the film. In some embodiments, the predictive metrology data includes a contour map having a set of spatial measurements, each spatial measurement indicating a thickness of a particular location of a plurality of locations on the substrate. In some embodiments, the predictive metrology data indicates an average predictive film thickness.

Figure 6:
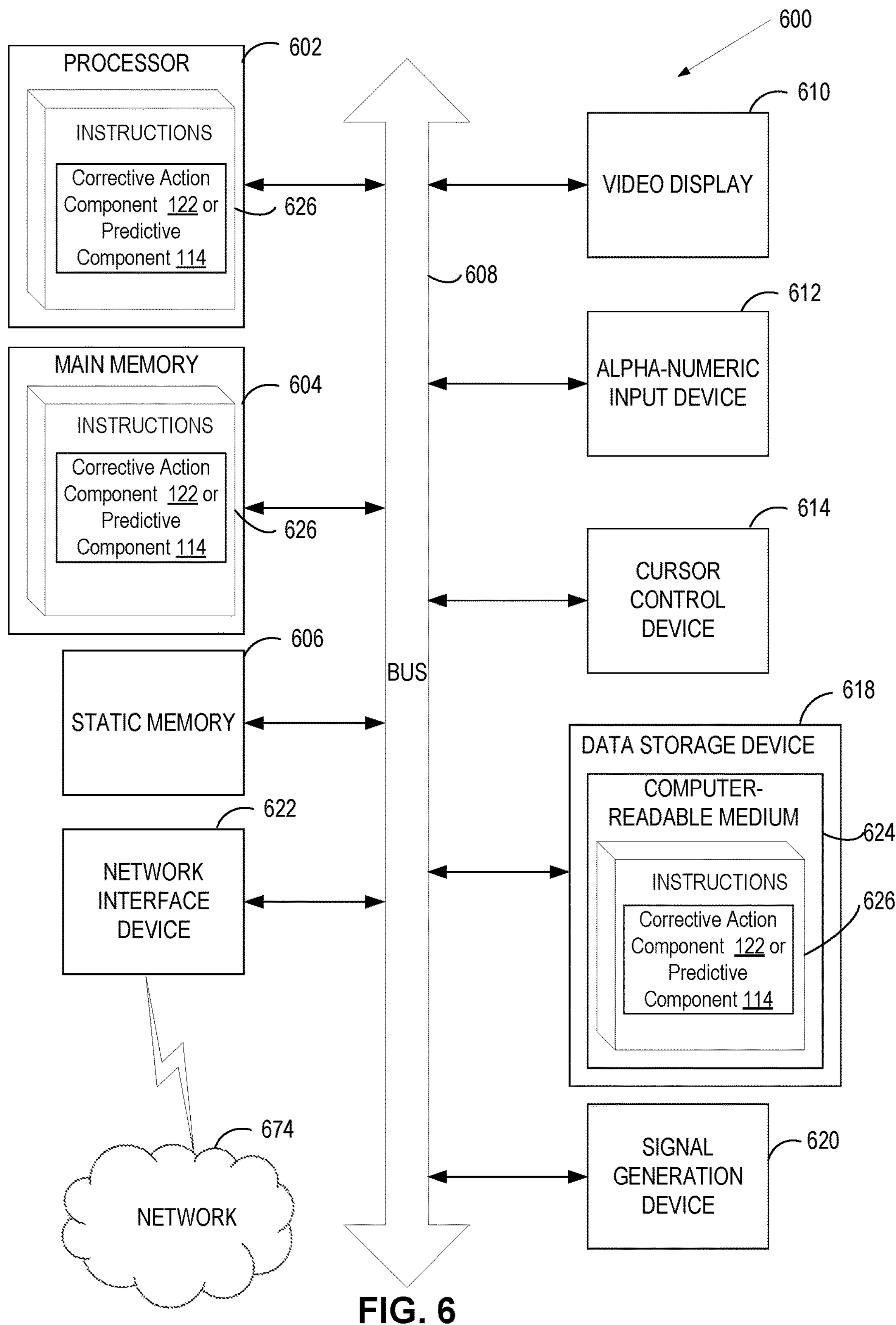
FIG. 6 is a block diagram illustrating a computer system, according to certain embodiments.

FIG. 6 is a block diagram illustrating a computer system 600, according to certain embodiments. In some embodiments, computer system 600 may be connected (e.g., via a network, such as a Local Area Network (LAN), an intranet, an extranet, or the Internet) to other computer systems. Computer system 600 may operate in the capacity of a server or a client computer in a client-server environment, or as a peer computer in a peer-to-peer or distributed network environment. Computer system 600 may be provided by a personal computer (PC), a tablet PC, a Set-Top Box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 600 may include a processing device 602, a volatile memory 604 (e.g., Random Access Memory (RAM)), a non-volatile memory 606 (e.g., Read-Only Memory (ROM) or Electrically-Erasable Programmable ROM (EEPROM)), and a data storage device 616, which may communicate with each other via a bus 608.

Processing device 602 may be provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor).

Computer system 600 may further include a network interface device 622 (e.g., coupled to network 674). Computer system 600 also may include a video display unit 610 (e.g., an LCD), an alphanumeric input device 612 (e.g., a keyboard), a cursor control device 614 (e.g., a mouse), and a signal generation device 620.

In some implementations, data storage device 616 may include a non-transitory computer-readable storage medium 624 on which may store instructions 626 encoding any one or more of the methods or functions described herein, including instructions encoding components of FIG. 1 (e.g., corrective action component 122, predictive component 114, etc.) and for implementing methods described herein.

Instructions 626 may also reside, completely or partially, within volatile memory 604 and/or within processing device 602 during execution thereof by computer system 600, hence, volatile memory 604 and processing device 602 may also constitute machine-readable storage media.

While computer-readable storage medium 624 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The methods, components, and features described herein may be implemented by discrete hardware components or may be integrated in the functionality of other hardware components such as ASICS, FPGAs, DSPs or similar devices. In addition, the methods, components, and features may be implemented by firmware modules or functional circuitry within hardware devices. Further, the methods, components, and features may be implemented in any combination of hardware devices and computer program components, or in computer programs.

Unless specifically stated otherwise, terms such as "receiving," "performing," "providing," "obtaining," "causing," "accessing," "determining," "adding," "using," "training," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and may not have an ordinal meaning according to their numerical designation.

Examples described herein also relate to an apparatus for performing the methods described herein. This apparatus may be specially constructed for performing the methods described herein, or it may include a general purpose computer system selectively programmed by a computer program stored in the computer system. Such a computer program may be stored in a computer-readable tangible storage medium.

The methods and illustrative examples described herein are not inherently related to any particular computer or other apparatus. Various general purpose systems may be used in accordance with the teachings described herein, or it may prove convenient to construct more specialized apparatus to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A method comprising:

obtaining sensor data associated with a deposition process performed in a process chamber to deposit film on a surface of a substrate;

generating a plurality of physics based outputs using a transformation function and the sensor data, wherein the transformation function comprises functions associated with at least one of chemical kinetics or Langmuir adsorption model;

mapping the physics based outputs to a training set; and training a virtual model based on the training set and the sensor data, wherein the virtual model is trained to generate predictive metrology data associated with the film.

2. The method of claim 1, further comprising:

updating the virtual model based on a comparison between the predictive metrology data and measured metrology data.

3. The method of claim 1, wherein the transformation function comprises functions associated with Arrhenius Equation.

4. The method of claim 1, further comprising:

using the transformation function to compute a Maxwell distribution function for the process chamber.

5. The method of claim 1, further comprising:

using the transformation function to estimate site availability for growth at equilibrium condition for the process chamber.

6. The method of claim 1, further comprising:

using the transformation function to estimate boundary layer thickness in an equilibrium condition for the process chamber.

7. The method of claim 1, further comprising:

determining, using the virtual model, real-time predictive metrology data for a current substrate undergoing a current deposition process.

8. The method of claim 7, further comprising:

adjusting a deposition process recipe associated with the current deposition process based on the real-time predictive metrology data.

9. A system comprising:

a memory; and a processing device, coupled to the memory, to:

obtain sensor data associated with a deposition process performed in a process chamber to deposit film on a surface of a substrate;

generate a plurality of physics based outputs using a transformation function and the sensor data, wherein the transformation function comprises functions associated with at least one of chemical kinetics or Langmuir adsorption model;

map the physics based outputs to a training set; and train a virtual model based on the training set and the sensor data, wherein the virtual model is trained to generate predictive metrology data associated with the film.

10. The system of claim 9, wherein the processing device is further to:

update the virtual model based on a comparison between the predictive metrology data and measured metrology data.

11. The system of claim 9, wherein the transformation function comprises functions associated with Arrhenius Equation.

12. The system of claim 9, wherein the processing device is further to:

use the transformation function to compute a Maxwell distribution function for the process chamber.

13. The system of claim 9, wherein the processing device is further to:

use the transformation function to estimate site availability for growth at equilibrium condition for the process chamber.

14. The system of claim 9, wherein the processing device is further to:

use the transformation function to estimate boundary layer thickness in an equilibrium condition for the process chamber.

15. The system of claim 9, wherein the processing device is further to:

determine, using the virtual model, real-time predictive metrology data for a current substrate undergoing a current deposition process, and adjust a deposition process recipe associated with the current deposition process based on the real-time predictive metrology data.

16. A non-transitory machine-readable storage medium storing instructions which, when executed cause a processing device to perform operations comprising:

obtaining sensor data associated with a deposition process performed in a process chamber to deposit film on a surface of a substrate;

generating a plurality of physics based outputs using a transformation function and the sensor data, wherein the transformation function comprises functions associated with at least one of chemical kinetics or Langmuir adsorption model;

mapping the physics based outputs to a training set; and training a virtual model based on the training set and the sensor data, wherein the virtual model is trained to generate predictive metrology data associated with the film.

17. A method comprising:

obtaining a plurality of sensor values associated with a deposition process performed in a process chamber to deposit film on a surface of a substrate;

applying a virtual model to the plurality of sensor values, the virtual model trained based on historical sensor data and a plurality of physics based outputs used to process non-linear relationships between the historical sensor data from different sensors in the process chamber, wherein the plurality of physics based outputs were generated using a transformation function and the historical sensor data, wherein the transformation function comprises functions associated with at least one of chemical kinetics or Langmuir adsorption model; and obtaining an output of the virtual model, the output identifying predictive metrology data for the film.

18. The method of claim 17, wherein the predictive metrology data comprises a contour map including a set of spatial measurements each indicating a thickness of a particular location of a plurality of locations on the substrate.

19. The method of claim 17, wherein the predictive metrology data indicates an average predictive film thickness.

20. The method of claim 17, wherein the transformation function comprises functions associated with Arrhenius Equation.

21. The method of claim 17, wherein the transformation function is used to compute a Maxwell distribution function for the process chamber.

22. The method of claim 17, wherein the transformation function is used to estimate site availability for growth at equilibrium condition for the process chamber.

23. The method of claim 17, wherein the transformation function is used to estimate boundary layer thickness in an equilibrium condition for the process chamber.

* * * * *